(12) United States Patent
Nishibayashi et al.

(10) Patent No.: US 12,286,726 B2
(45) Date of Patent: Apr. 29, 2025

(54) DIAMOND COMPOSITE BODY, SUBSTRATE, DIAMOND, TOOL INCLUDING DIAMOND, AND METHOD FOR MANUFACTURING DIAMOND

(71) Applicant: Sumitomo Electric Industries, Ltd., Osaka (JP)

(72) Inventors: Yoshiki Nishibayashi, Itami (JP); Natsuo Tatsumi, Itami (JP); Hitoshi Sumiya, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 817 days.

(21) Appl. No.: 17/227,950

(22) Filed: Apr. 12, 2021

(65) Prior Publication Data

US 2021/0230766 A1    Jul. 29, 2021

Related U.S. Application Data

(62) Division of application No. 15/502,947, filed as application No. PCT/JP2015/072619 on Aug. 10, 2015, now Pat. No. 11,001,938.

(30) Foreign Application Priority Data

Aug. 11, 2014    (JP) ................................ 2014-163385

(51) Int. Cl.
   *C30B 25/18*    (2006.01)
   *C23C 16/01*    (2006.01)
   (Continued)

(52) U.S. Cl.
   CPC ............ *C30B 25/186* (2013.01); *C23C 16/01* (2013.01); *C23C 16/02* (2013.01); *C23C 16/274* (2013.01);
   (Continued)

(58) Field of Classification Search
   CPC ....... C30B 25/186; C30B 29/04; C30B 33/06; C30B 25/20; C30B 31/22; C30B 33/04;
   (Continued)

(56) References Cited

U.S. PATENT DOCUMENTS 4,406,992 A * 9/1983 Kurtz .................... G01L 1/2293
                                                    257/417
5,198,069 A * 3/1993 Zimmermann ..... H01L 27/1446
                                                    257/E31.093
(Continued)

FOREIGN PATENT DOCUMENTS

CN    103 620 093 A  *  3/2014  ........... C30B 25/105
EP    0612868 A1    8/1994
(Continued)

OTHER PUBLICATIONS

Machine Translation of JP 2013-053051 to Sumitomo Electric Industries (Year: 2013).*

(Continued)

*Primary Examiner* — Daniel C. McCracken
(74) *Attorney, Agent, or Firm* — McCarter & English, LLP; Michael A. Sartori

(57) ABSTRACT

Provided are a diamond composite body capable of shortening a separation time for separating a substrate and a diamond layer, the substrate, and a method for manufacturing a diamond, as well as a diamond obtained from the diamond composite body and a tool including the diamond. The diamond composite body includes a substrate including a diamond seed crystal and having grooves in a main surface, a diamond layer formed on the main surface of the substrate, and a non-diamond layer formed on a substrate side at a constant depth from an interface between the substrate and the diamond layer.

1 Claim, 4 Drawing Sheets

(51) Int. Cl.

| | |
|---|---|
| *C23C 16/02* | (2006.01) |
| *C23C 16/27* | (2006.01) |
| *C25F 3/02* | (2006.01) |
| *C25F 5/00* | (2006.01) |
| *C30B 25/20* | (2006.01) |
| *C30B 29/04* | (2006.01) |
| *C30B 31/22* | (2006.01) |
| *C30B 33/04* | (2006.01) |
| *C30B 33/06* | (2006.01) |
| *C30B 33/10* | (2006.01) |

(52) U.S. Cl.
CPC .............. *C25F 3/02* (2013.01); *C25F 5/00* (2013.01); *C30B 25/20* (2013.01); *C30B 29/04* (2013.01); *C30B 31/22* (2013.01); *C30B 33/04* (2013.01); *C30B 33/06* (2013.01); *C30B 33/10* (2013.01); *Y10T 428/24479* (2015.01); *Y10T 428/2457* (2015.01); *Y10T 428/24612* (2015.01)

(58) Field of Classification Search
CPC ... C30B 33/10; C25F 5/00; C25F 3/02; C23C 16/274; C23C 16/01; C23C 16/02; C23C 16/26; C23C 16/27; C23C 16/271; C23C 16/272; C23C 16/275; C23C 16/276; C23C 16/277; C23C 16/278; C23C 16/279; C23C 14/06; C23C 14/0605; C23C 14/0611; Y10T 428/24479; Y10T 428/2457; Y10T 428/24612; C01B 32/25; C01B 32/26; C01B 32/28; B01J 3/06; B01J 3/062; B01J 3/065; B01J 3/067; B01J 3/08
See application file for complete search history.

(56) References Cited

U.S. PATENT DOCUMENTS

| | | | |
|---|---|---|---|
| 5,614,019 A | 3/1997 | Vichr et al. | |
| 5,753,038 A | 5/1998 | Vichr et al. | |
| 5,841,182 A * | 11/1998 | Linn | H01L 27/0805 257/532 |
| 6,582,513 B1 * | 6/2003 | Linares | C30B 25/20 423/446 |
| 2005/0118349 A1 | 6/2005 | Whitehead et al. | |
| 2008/0272396 A1 | 11/2008 | Fournel et al. | |
| 2009/0308305 A1 | 12/2009 | Mokuno et al. | |
| 2015/0191850 A1 | 7/2015 | Nishibayashi et al. | |

FOREIGN PATENT DOCUMENTS

| | | | | |
|---|---|---|---|---|
| GB | 2 500 485 A * | 9/2013 | | C23C 16/27 |
| JP | H06-247793 A | 9/1994 | | |
| JP | H09-124393 A | 5/1997 | | |
| JP | 2004 188 511 A * | 7/2004 | | |
| JP | 2008-031503 A | 2/2008 | | |
| JP | 2009-209028 A | 9/2009 | | |
| JP | 2010-222172 A | 10/2010 | | |
| JP | 2011-162373 A | 8/2011 | | |
| JP | 2011-195407 A | 10/2011 | | |
| JP | 2011-195411 A | 10/2011 | | |
| JP | 2012 092 018 A * | 5/2012 | | |
| JP | 2012-131707 A | 7/2012 | | |
| JP | 2013-053050 A | 3/2013 | | |
| JP | 2013-053051 | * | 3/2013 | C30B 25/02 |
| JP | 2013-053051 A | 3/2013 | | |
| JP | 2013-060329 A | 4/2013 | | |
| JP | 2013 203 596 A * | 10/2013 | | |
| TW | 2004 016 197 A * | 9/2004 | | |
| WO | WO 96 012 344 A1 * | 4/1996 | | H03H 9/02 |
| WO | WO 98 049 723 A1 * | 11/1998 | | H01L 21/321 |
| WO | WO 03 062 854 A2 * | 7/2003 | | G01T 1/26 |

OTHER PUBLICATIONS

International Search Report in counterpart International Application No. PCT/JP2015/072619, dated Oct. 27, 2015 [Cited in Parent].

* cited by examiner

DIAMOND COMPOSITE BODY, SUBSTRATE, DIAMOND, TOOL INCLUDING DIAMOND, AND METHOD FOR MANUFACTURING DIAMOND

TECHNICAL FIELD

The present invention relates to a diamond composite body, a substrate, a diamond, a tool including a diamond, and a method for manufacturing a diamond.

BACKGROUND ART

Diamond has many excellent properties such as high hardness, high heat conductivity, high light transmittance, wide bandgap, and the like. Accordingly, diamond is widely used as a material for various tools, optical components, semiconductors, and electronic components, and is expected to become more important in the future.

As industrial applications of diamond, in addition to naturally produced diamonds, artificially synthesized diamonds having a stable quality are mainly used. Most of artificial diamond single crystals are industrially synthesized at present in an environment having a temperature of about one thousand and several hundred degrees Celsius to two thousand and several hundred degrees Celsius and a pressure of more than or equal to several tens of thousands of atmospheres, which are conditions under which diamond is stably present. Since a ultrahigh-pressure container which generates such high temperature and high pressure is extremely expensive and is also limited in size, the synthesis of a large-sized single crystal by a high-temperature high-pressure synthesis method has a limit. As for type Ib diamond which contains nitrogen (N) as an impurity and assumes a yellow color, 1 cm-diameter class diamonds are manufactured by the high-temperature high-pressure synthesis method and sold. However, the size of this level is considered as a substantial upper limit. Further, as for type IIa diamond which is free of an impurity and is colorless and transparent, the high-temperature high-pressure synthesis method only allows the synthesis of much smaller diamonds having a diameter of less than or equal to about several millimeters.

On the other hand, besides the high-temperature high-pressure synthesis method, a chemical vapor synthesis method (hereinafter also referred to a Chemical Vapor Deposition (CVD) method) has been established as a method for synthesizing a diamond. This method allows the formation of a relatively large synthetic diamond having a diameter of about 6 inches, which is typically a polycrystalline film. However, when a diamond is used for a ultra-precision tool or an optical component which requires a particularly smooth surface among applications of diamond, a semiconductor which requires precise control of impurity concentration and high carrier mobility, or the like, a single crystal diamond should be used. Accordingly, a method for obtaining a single crystal diamond through epitaxial growth by the chemical vapor synthesis method has been conventionally considered.

Generally, epitaxial growth includes homoepitaxial growth in which a growing substance grows on a homogeneous substrate, and heteroepitaxial growth in which a growing substance grows on a heterogeneous substrate. Of these, homoepitaxial growth is considered to be more practical for the synthesis of a single crystal, because the obtained single crystal has an excellent crystallinity.

By homoepitaxial growth, a type IIa single crystal diamond larger than a type IIa diamond obtained by the high-temperature high-pressure synthesis method can be obtained by epitaxially growing a high-purity diamond from a vapor phase on a type Ib diamond substrate obtained by high-temperature high-pressure synthesis.

However, when homoepitaxial growth is adopted to synthesize a diamond, problems are posed as to how to remove a substrate and how to reuse the substrate. When a type IIa diamond film is obtained by chemical vapor synthesis using a type Ib diamond or the like as a substrate, it is necessary to remove the type Ib diamond substrate from a grown diamond layer by a certain method. As such a method, a method for separating an epitaxial film and a substrate can be adopted, and laser slicing is a typical method. However, as a diamond has an increased area, the diamond should have a thicker thickness in order to be subjected to slicing, and slicing becomes less successful.

Accordingly, PTD 1 (Japanese Patent Laying-Open No. 2008-031503) has proposed a method for separating/delaminating a diamond substrate and a diamond layer without damaging them, by growing the diamond layer on the diamond substrate by a chemical vapor synthesis method, implanting ions from a growth surface with energy high enough to hardly deteriorate the crystallinity of an outermost surface to form an ion implantation layer directly on the diamond substrate, and thereafter etching the implantation layer by an electrochemical technique. However, with the technique of PTD 1 (Japanese Patent Laying-Open No. 2008-031503), it takes as long as 12 hours to separate a 4 mm-square diamond single crystal substrate and a diamond grown thereon, prolonging the manufacturing process.

PTD 2 (Japanese Patent Laying-Open No. 2011-195407) and PTD 3 (Japanese Patent Laying-Open No. 2011-195411) have proposed a method for separating, in a structural body made of diamond in which a diamond layer, an electrically conductive non-diamond layer obtained by implanting ions into diamond, and a diamond layer are alternately stacked, the diamond layers in a relatively short time by using an etching solution having predetermined pH and electric conductivity as an etching solution for the non-diamond layer.

CITATION LIST

Patent Document

PTD 1: Japanese Patent Laying-Open No. 2008-031503
PTD 2: Japanese Patent Laying-Open No. 2011-195407
PTD 3: Japanese Patent Laying-Open No. 2011-195411

SUMMARY OF INVENTION

Technical Problem

With the techniques of PTD 2 and PTD 3, when the structural body made of diamond is dipped in the etching solution, the etching solution permeates from an externally exposed portion of the non-diamond layer into the non-diamond layer. Since the non-diamond layer has an extremely thin thickness, the permeation speed of the etching solution into the non-diamond layer is significantly slow. Therefore, as the size of a substrate is increased, the separation speed for separating the diamond layers also becomes significantly slow, causing an increase in manufacturing cost.

Accordingly, the present object is to provide a diamond composite body capable of shortening a separation time for separating a substrate and a diamond layer, the substrate, and a method for manufacturing a diamond, as well as a diamond obtained from the diamond composite body and a tool including the diamond.

Solution to Problem

A diamond composite body in accordance with one aspect of the present invention includes a substrate including a diamond seed crystal and having grooves in a main surface, a diamond layer formed on the main surface of the substrate, and a non-diamond layer formed on a substrate side at a constant depth from an interface between the substrate and the diamond layer.

A substrate in accordance with one aspect of the present invention is a substrate including a diamond seed crystal, a main surface of the substrate having an off angle of more than or equal to 0° and less than or equal to 15° with respect to a (001) plane, the main surface of the substrate having grooves which are substantially parallel to a <100> direction.

A diamond in accordance with one aspect of the present invention is a diamond including the diamond layer, obtained by electrochemically etching the non-diamond layer of the diamond composite body in accordance with one aspect of the present invention and separating the diamond layer and the substrate.

A diamond in accordance with one aspect of the present invention is a diamond having a set of main surfaces, and including a line-shaped or lattice-shaped optical distortion when observed with light vertically passing through the set of main surfaces.

A diamond in accordance with one aspect of the present invention is a diamond including a diamond layer having a set of main surfaces, and a layer containing implanted ions arranged on at least one of the main surfaces of the diamond layer, the layer containing implanted ions having line-shaped or lattice-shaped grooves penetrating to the diamond layer. When the layer containing implanted ions has a thin thickness, the grooves are each recognized as a boundary not containing implanted ions between layers containing implanted ions adjacent to each other on the main surface.

A diamond in accordance with one aspect of the present invention is a diamond having a set of main surfaces, including a line-shaped or lattice-shaped array in mapping of intensities of photoluminescence (PL) and cathode luminescence (CL), or secondary electron intensity, reflected electron intensity, and absorbed current intensity in SEM, when observed from any one of the main surfaces.

A diamond in accordance with one aspect of the present invention is a polycrystalline diamond having a first main surface and a second main surface, including a line-shaped or lattice-shaped optical distortion in a surface of the first main surface, an average particle size of a surface of the second main surface being more than or equal to 50% and less than or equal to 200% of an average particle size of the surface of the first main surface in a region except for a periodic peak area of the optical distortion.

A tool in accordance with one aspect of the present invention is a tool including the diamond in accordance with one aspect of the present invention.

A method for manufacturing a diamond in accordance with one aspect of the present invention is a method for manufacturing a diamond including a diamond layer by a chemical vapor synthesis method, including preparing a substrate including a diamond seed crystal and having grooves in a main surface, forming a non-diamond layer at a constant depth from a surface of the main surface of the substrate by implanting ions into the substrate, growing the diamond layer on the main surface of the substrate by the chemical vapor synthesis method, and separating the diamond layer from the substrate by electrochemically etching the non-diamond layer.

A method for manufacturing a diamond in accordance with one aspect of the present invention is a method for manufacturing a diamond including a diamond layer by a chemical vapor synthesis method, including preparing a substrate including a diamond seed crystal, forming a non-diamond layer at a constant depth from a surface of a main surface of the substrate by implanting ions into the substrate, forming grooves in the main surface of the substrate, growing the diamond layer on the main surface of the substrate by the chemical vapor synthesis method, and separating the diamond layer from the substrate by electrochemically etching the non-diamond layer.

Advantageous Effects of Invention

According to the above aspects, a diamond composite body capable of shortening a separation time for separating a substrate and a diamond layer, the substrate, and a method for manufacturing a diamond can be provided. Further, a diamond obtained from the diamond composite body and a tool including the diamond can be provided.

DESCRIPTION OF EMBODIMENTS

Figure 1:
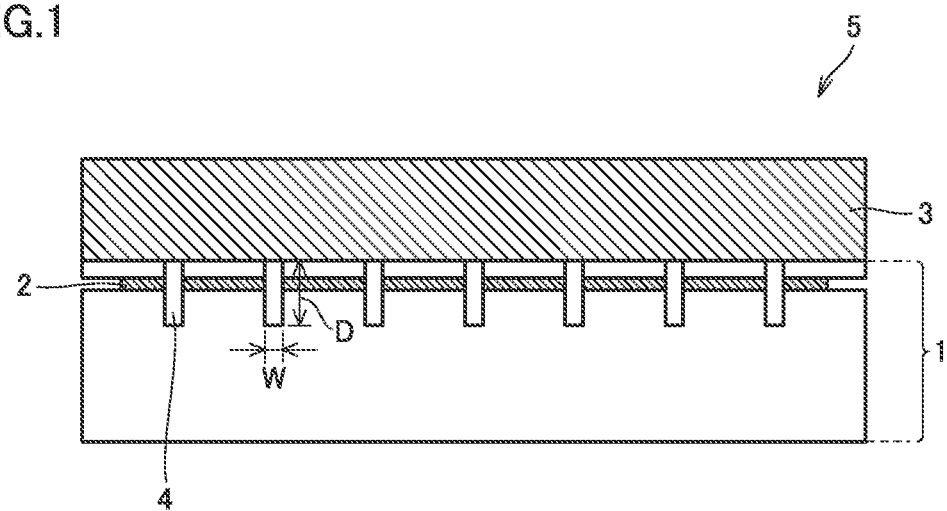
FIG. 1 is a schematic cross sectional view of a diamond composite body in accordance with one aspect of the present invention.

Description of Embodiment of the Present Invention

First, an embodiment of the present invention will be described in list form.

(1) A diamond composite body in accordance with one aspect of the present invention includes a substrate including a diamond seed crystal and having grooves in a main surface, a diamond layer formed on the main surface of the substrate, and a non-diamond layer formed on a substrate side at a constant depth from an interface between the substrate and the diamond layer.

Since the diamond composite body includes the substrate having grooves, when the diamond composite body is dipped in an etching solution, the etching solution easily flows through the grooves in the substrate and permeates into the non-diamond layer. Therefore, a separation time taken when separating the substrate and the diamond layer by etching the non-diamond layer using an electrochemical technique is shortened.

(2) Preferably, the main surface of the substrate has an off angle of more than or equal to 0° and less than or equal to 15° with respect to a (001) plane, and the grooves in the main surface of the substrate are substantially parallel to a <100> direction. Thereby, the diamond layer formed on the main surface of the substrate has an improved uniformity.

(3) Preferably, the grooves in the main surface of the substrate have a width W of more than or equal to 0.1 μm and less than or equal to 30 μm. Thereby, the diamond layer formed on the main surface of the substrate grows to bridge each groove in the vicinity of the main surface of the substrate, that is, to cover an upper surface of each groove, and thus surfaces of the diamond layer are flattened.

(4) Preferably, a value of a ratio D/W between a width W and a depth D of the grooves in the main surface of the substrate is more than or equal to 3 and less than or equal to 50. Thereby, the diamond layer formed on the main surface of the substrate does not fill the entire inside of the grooves in the substrate, and thus the grooves still remain in the substrate even after the substrate and the diamond layer are separated. Therefore, the substrate can be reused next time without forming grooves again.

(5) Preferably, the main surface of the substrate further has grooves intersecting with the grooves which are substantially parallel to the <100> direction. Thereby, the permeation speed of the etching solution into the non-diamond layer when the diamond composite body is dipped in the etching solution is further improved. Therefore, the separation time taken when separating the substrate and the diamond layer by etching the non-diamond layer using an electrochemical technique is further shortened.

(6) Further, a substrate in accordance with one aspect of the present invention is a substrate including a diamond seed crystal, a main surface of the substrate having an off angle of more than or equal to 0° and less than or equal to 15° with respect to a (001) plane, the main surface of the substrate having grooves which are substantially parallel to a <100> direction.

When the main surface of the substrate has an off angle of more than or equal to 0° and less than or equal to 15° with respect to the (001) plane, a thick diamond can be efficiently formed on the substrate, and the uniformity of the diamond can be improved. Further, when the grooves in the main surface of the substrate are substantially parallel to the <100> direction, the diamond easily bridges each groove in the vicinity of the main surface of the substrate, that is, easily covers the upper surface of each groove, when the diamond layer grows on the substrate, and thus the surfaces of the diamond layer can be flattened.

(7) Further, a diamond in accordance with one aspect of the present invention is a diamond including the diamond layer, obtained by electrochemically etching the non-diamond layer of the diamond composite body described in (1) to (5), and separating the diamond layer and the substrate.

(8) Further, a diamond in accordance with one aspect of the present invention is a diamond having a set of main surfaces, and including a line-shaped or lattice-shaped optical distortion when observed with light vertically passing through the set of main surfaces. Since the diamond is obtained by electrochemically etching the non-diamond layer of the diamond composite body described in (1) to (5), and separating the diamond layer and the substrate, the diamond is separated in a shorter separation time, and its cost is reduced. It should be noted that "vertically passing through the set of main surfaces" means that the passing light has an angle in the range of 80° to 100° with respect to the main surfaces.

(9) Preferably, in a region of more than or equal to 90% of a surface of the main surface, an average value of phase differences of the optical distortion is less than 50 nm. This can prevent the separated diamond layer from breaking when it is made independent, due to a stress difference between a line-shaped or lattice-shaped portion and a portion other than that.

(10) Preferably, in a region of more than or equal to 90% of a surface of the main surface, a maximum value of phase differences in a region except for a periodic peak area of the optical distortion is less than or equal to 90 nm. This can prevent occurrence of cracks within the diamond layer when the separated diamond layer is made independent, due to a stress difference within the region except for the periodic peak area.

(11) Preferably, the optical distortion is substantially parallel to a <100> direction. Thereby, when the separated diamond layer is made independent, a stress concentration location within the diamond layer is not located in the vicinity of a <110> axis direction, and the direction in which the diamond layer is less likely to break is maintained. Further, the diamond is separated from the diamond composite body in a further shorter separation time, and its cost can be reduced.

(12) Preferably, the optical distortion accounts for a region of more than or equal to 20% of a surface of the main surface. Thereby, it is easily determined whether a diamond has been obtained from the diamond composite body described in (1) to (5).

(13) Further, a diamond in accordance with one aspect of the present invention is a diamond including a diamond layer having a set of main surfaces, and a layer containing implanted ions arranged on at least one of the main surfaces of the diamond layer, the layer containing implanted ions having line-shaped or lattice-shaped grooves penetrating to the diamond layer. When the diamond is bonded as a heatsink or a cutting bite to a heterogeneous substrate such as a heat dissipation plate or a shank, an excessive bonding material can flow out of the grooves. Further, adhesion between the diamond and the heat dissipation plate is improved, and heat dissipation is facilitated.

(14) Further, a diamond in accordance with one aspect of the present invention is a polycrystalline diamond having a first main surface and a second main surface, including a line-shaped or lattice-shaped optical distortion in a surface of the first main surface, an average particle size of a surface of the second main surface being more than or equal to 50% and less than or equal to 200% of an average particle size of the surface of the first main surface in a region except for a periodic peak area of the optical distortion. This structure provides a material which is uniform in particle size and grain boundary, when compared with a conventional polycrystalline structure on a heterogeneous substrate. Since the diamond is obtained by electrochemically etching the non-diamond layer of the diamond composite body described in (1) to (5), and separating the diamond layer and the substrate, the diamond is separated in a shorter separation time, and its cost is reduced.

(15) Further, a tool in accordance with one aspect of the present invention is a tool including the diamond described in any of (7) to (14).

Since the diamond is separated from the diamond composite body at a high speed, manufacturing costs of the diamond and the tool including the diamond are reduced.

(16) Further, a method for manufacturing a diamond in accordance with one aspect of the present invention is a method for manufacturing a diamond including a diamond layer by a chemical vapor synthesis method, including preparing a substrate including a diamond seed crystal and having grooves in a main surface, forming a non-diamond layer at a constant depth from a surface of the main surface of the substrate by implanting ions into the substrate, growing the diamond layer on the main surface of the substrate by the chemical vapor synthesis method, and separating the diamond layer from the substrate by electrochemically etching the non-diamond layer.

Since the substrate having grooves in the main surface is used in the method for manufacturing the diamond described in (16), when the substrate having the diamond layer formed on the main surface of the substrate is dipped in an etching solution, the etching solution easily flows through the grooves in the substrate and permeates into the non-diamond layer. Therefore, the separation time taken when separating the substrate and the diamond layer by etching the non-diamond layer using an electrochemical technique can be shortened.

(17) A method for manufacturing a diamond in accordance with one aspect of the present invention is a method for manufacturing a diamond including a diamond layer by a chemical vapor synthesis method, including preparing a substrate including a diamond seed crystal, forming a non-diamond layer at a constant depth from a surface of a main surface of the substrate by implanting ions into the substrate, forming grooves in the main surface of the substrate, growing the diamond layer on the main surface of the substrate by the chemical vapor synthesis method, and separating the diamond layer from the substrate by electrochemically etching the non-diamond layer.

In the method for manufacturing the diamond described in (17), grooves are formed in the main surface of the substrate, and thereafter the substrate having the diamond layer formed on the main surface of the substrate is dipped in an etching solution. Accordingly, the etching solution easily flows through the grooves in the substrate and permeates into the non-diamond layer. Therefore, the separation time taken when separating the substrate and the diamond layer by etching the non-diamond layer using an electrochemical technique can be shortened.

Details of Embodiment of the Present Invention

Specific examples of a diamond composite body, a substrate, a diamond, a tool, and a method for manufacturing the diamond in accordance with the embodiment of the present invention will be described below with reference to the drawings. In the drawings below, identical or corresponding parts will be designated by the same reference numerals, and the description thereof will not be repeated. It should be noted that the present invention is not limited to these examples and is defined by the scope of the claims, and is intended to include any modifications within the scope and meaning equivalent to the scope of the claims.

<Diamond Composite Body>

FIG. 1 is a schematic cross sectional view of a diamond composite body in accordance with the embodiment of the present invention. A diamond composite body 5 includes a substrate 1 including a diamond seed crystal and having grooves 4 in a main surface, a diamond layer 3 formed on the main surface of substrate 1, and a non-diamond layer 2 formed on the substrate 1 side at a constant depth from an interface between substrate 1 and diamond layer 3.

In diamond composite body 5 in accordance with the embodiment of the present invention, since substrate 1 has grooves, when diamond composite body 5 is dipped in an etching solution, the etching solution easily flows through the grooves in substrate 1 and permeates into non-diamond layer 2. Therefore, a separation time taken when separating substrate 1 and diamond layer 3 by etching non-diamond layer 2 using an electrochemical technique is shortened.

<Substrate>

Substrate 1 may be a single crystal diamond, or may be a polycrystalline diamond. Since a single crystal diamond is more expensive, substrate 1 is preferably a single crystal diamond, from the viewpoint of more significantly exhibiting the effect of the embodiment of the present invention. Substrate 1 preferably has a high crystallinity. When substrate 1 has a high crystallinity, diamond layer 3 formed on substrate 1 can also have a high crystallinity. A high crystallinity means having less defects such as dislocations, and having less fluctuation or distortion of crystal axes. Substrate 1 is preferably a single crystal diamond manufactured by the high-temperature high-pressure synthesis method. A single crystal diamond manufactured by the high-temperature high-pressure synthesis method has a uniform crystal structure and a high crystallinity. However, substrate 1 may be a single crystal diamond manufactured by the chemical vapor synthesis method. Alternatively, substrate 1 may be prepared by processing a diamond obtained from the diamond composite body in accordance with the embodiment of the present invention.

Substrate 1 has grooves 4 in the main surface. Grooves 4 can be formed, for example, by emitting laser light onto the flat main surface of the substrate. In the case where grooves 4 are formed in the main surface of substrate 1, when diamond composite body 5 is dipped in an etching solution, the etching solution easily flows through the grooves in substrate 1 and permeates into non-diamond layer 2. Therefore, the separation time taken when separating substrate 1 and diamond layer 3 by etching non-diamond layer 2 using an electrochemical technique is shortened.

Preferably, the grooves in the main surface of substrate 1 are substantially parallel to a <100> direction. In the case where the grooves in the main surface of substrate 1 are substantially parallel to the <100> direction, the diamond layer formed on the main surface of the substrate can have an improved uniformity.

Figure 2:
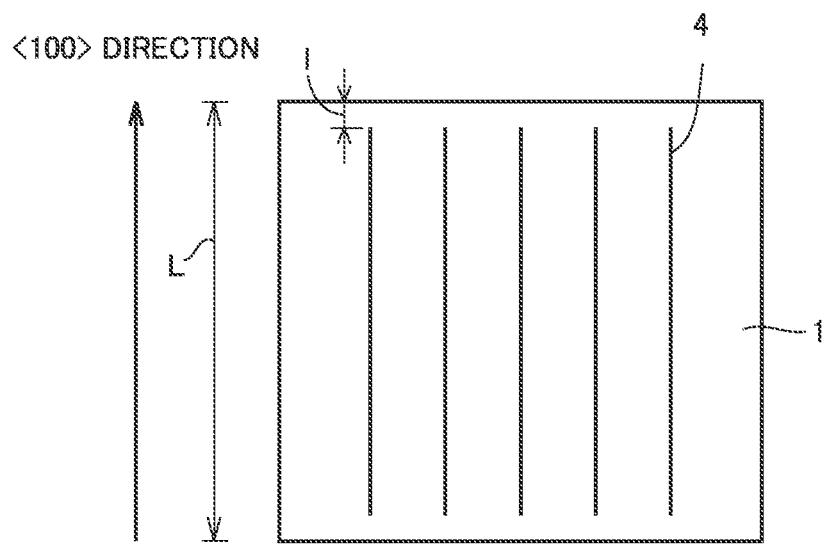
FIG. 2 is a top view of a main surface side of a substrate in accordance with one aspect of the present invention.

FIG. 2 is a top view of the main surface side of substrate 1. Although grooves 4 are parallel to the <100> direction in FIG. 2, grooves 4 may be substantially parallel to the <100> direction. Here, being substantially parallel to the <100> direction means that grooves 4 intersect with the <100> direction at an angle of more than or equal to 0° and less than or equal to ±30°, preferably more than or equal to 0° and less than or equal to ±20°.

It should be noted that, if grooves 4 are parallel to a <110> direction, the substrate may break easily, which is not preferable. In addition, if grooves 4 are parallel to the <110> direction, it is difficult for a diamond to grow to bridge each groove in the vicinity of the main surface of the substrate, that is, to cover an upper surface of each groove, when the diamond layer grows on the main surface of the substrate, and the flatness of surfaces of the diamond is impaired, which is not preferable.

Figure 3:
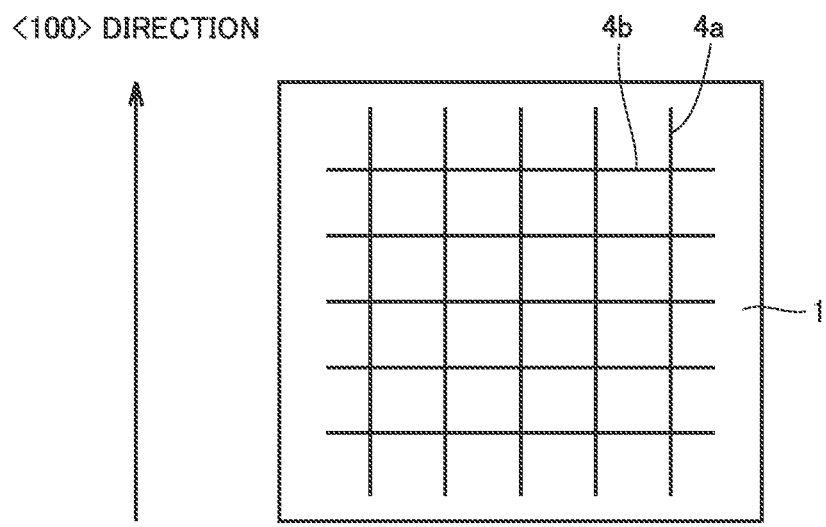
FIG. 3 is a top view of a main surface side of a substrate in accordance with one aspect of the present invention.

Preferably, substrate 1 further has grooves 4a which are substantially parallel to the <100> direction, and grooves 4b intersecting with grooves 4a, as shown for example in FIG. 3. In the case where substrate 1 has grooves 4a and grooves 4b, the permeation speed of the etching solution into the non-diamond layer when the diamond composite body is dipped in the etching solution is further improved. Therefore, the separation time taken when separating the substrate and the diamond layer by etching the non-diamond layer using an electrochemical technique is further shortened. From the viewpoint of the strength of the diamond layer above the grooves, the intersection angle between grooves 4a and grooves 4b is preferably more than or equal to 30° and less than or equal to 90°, more preferably more than or equal to 50° and less than or equal to 90°, further preferably more than or equal to 70° and less than or equal to 90°, and most preferably 90°. From the viewpoint of the electrochemical etching rate, the intersection angle between grooves 4a and grooves 4b is preferably an acute angle. For example, the intersection angle is preferably less than 90°, further preferably less than 60°, and most preferably 30°. Therefore, the angles between grooves 4a and grooves 4b and the <100> direction should be determined comprehensively considering both the viewpoints of the strength of the diamond and the etching rate, based on priorities thereof and the like.

The grooves have a width W of preferably more than or equal to 0.1 μm and less than or equal to 30 μm, more preferably more than or equal to 0.1 μm and less than or equal to 20 μm, more preferably more than or equal to 0.3 μm and less than or equal to 10 μm, and further preferably more than or equal to 0.5 μm and less than or equal to 5 μm. Thereby, the diamond can grow to bridge each groove in the vicinity of the main surface of the substrate, that is, to cover the upper surface of each groove, when the diamond layer grows on the main surface of the substrate, and thus the surfaces of the diamond are flattened. It should be noted that width W of the grooves means the distance of the width of each groove 4 exposed in the main surface of substrate 1.

The value of a ratio D/W between width W and a depth D of the grooves is preferably more than or equal to 3 and less than or equal to 50, more preferably more than or equal to 5 and less than or equal to 40, and further preferably more than or equal to 10 and less than or equal to 30. Thereby, the diamond does not fill the entire inside of the grooves in the substrate when the diamond layer grows on the main surface of the substrate. Therefore, the grooves still remain in the substrate even after the substrate and the diamond layer are separated, and thus the substrate can be reused without forming grooves again in the substrate. It should be noted that depth D of the grooves means the distance from the main surface of substrate 1 to a position of each groove 4 which is most apart therefrom in a thickness direction of substrate 1.

The grooves preferably have a deeper depth D, because the diamond layer formed on the main surface of the substrate does not fill the entire grooves in the substrate. However, if depth D of the grooves is more than two thirds of the thickness of the substrate, there is posed a problem that the substrate may break easily. Accordingly, from the viewpoint of securing the strength of the substrate, depth D of the grooves is preferably less than or equal to two thirds of the thickness of the substrate, more preferably less than or equal to half of the thickness of the substrate, and further preferably less than or equal to one third of the thickness of the substrate.

If end portions of each groove reach outer edges of the substrate, the etching solution easily flows through the grooves and permeates into the non-diamond layer, which is preferable. However, there is also posed a problem that the substrate may break easily. Accordingly, from the viewpoint of securing the strength of the substrate, it is preferable that the end portions of each groove do not reach the outer edges of the substrate, as shown for example in FIGS. 2 and 3. In this case, a distance l between each end portion of each groove and the outer edge of the substrate is preferably more than or equal to 2% and less than or equal to 20% of one side L of the substrate, and further preferably more than or equal to 5% and less than or equal to 10% of one side L of the substrate. Thereby, the etching solution easily permeates into the non-diamond layer, with the strength of the substrate being secured. In cases where the strength of the substrate can be secured, such as, for example, a case where the thickness of the substrate is larger than depth D of the grooves by more than or equal to 10 times, and a case where the substrate is bonded to a heterogeneous substrate and thereby reinforced, distance l to the outer edge can be set to 0 mm. Thereby, the etching rate becomes faster.

The interval between the grooves is preferably more than or equal to 10 μm and less than or equal to 5 mm, more preferably more than or equal to 100 μm and less than or equal to 5 mm, and further preferably more than or equal to 500 μm and less than or equal to 3 mm. Here, the interval between the grooves means a minimum distance from the center of a groove in a width direction to the center of an adjacent groove in the width direction. Thereby, etching can proceed in parallel, the grooves can have a sufficient width, and design with a high degree of freedom can be performed. The interval between the grooves may be more than or equal to 2% and less than or equal to 20% of one side L of the substrate. For example, in the case where the substrate size is increased to 25 mm or more, the effect of the present invention can be exhibited even if the interval is 5 mm or more. The interval between the grooves is preferably more than or equal to five times the width of the grooves, and further preferably more than or equal to 10 times the width of the grooves. The diamond layer above a groove portion tends to have a high distortion, and if the interval between the grooves is less than five times the width of the grooves, a distortion in the diamond layer above a non-groove portion may have a significant effect on a less-distorted portion of the diamond layer. It should be noted that, when the interval between the grooves is more than or equal to 10 times the width of the grooves, an average phase difference (optical distortion) in the main surface of the diamond layer is extremely decreased, which is preferable. More preferably, the interval between the grooves is more than or equal to 100 times the width of the grooves.

In order to efficiently form diamond layer 3 to have a large thickness (in an up/down direction in FIG. 1) in diamond composite body 5, the main surface of substrate 1 is preferably a (001) plane. Further, in order to further improve the uniformity of the crystal of diamond layer 3, the main surface of substrate 1 has an off angle of preferably more than or equal to 0° and less than or equal to 15°, more preferably more than or equal to 1.5° and less than or equal to 8°, with respect to the (001) plane. In the case where diamond layer 3 has a thin thickness of less than or equal to 50 μm, the composite body has a great significance. Namely, thin diamond layer 3 alone may break easily when it is made independent, whereas thin diamond layer 3 incorporated in the composite body is less likely to break. Furthermore, in the case where the diamond layer side of the composite body is bonded to an insulator or the like and thereafter the diamond layer is electrochemically separated from substrate 1, diamond layer 3 is avoided from being alone during the process, and diamond layer 3 can be held on the insulator or the like without breakage.

The thickness of substrate 1 is preferably more than or equal to 100 μm from the viewpoint of handling, and is preferably less than or equal to 3 mm from the viewpoint of easy availability. However, the effect of the present invention can be obtained even when the thickness of the substrate is more than 3 mm. The thickness of substrate 1 is defined as the thickness measured in the vicinity of the center of the main surface of substrate 1. Although the shape of the main surface of substrate 1 is typically a quadrangle, it may be a polygon or a circle. In the case where the shape of the main surface of substrate 1 is a quadrangle, one side of the quadrangle preferably has a long length from the viewpoint of enlarging the cross sectional area of manufactured diamond layer 3 in a growth direction. Practically, one side of one substrate has a length of about 3 mm to 12 mm, and one side of a mosaic-shaped bonded substrate in which a plurality of single crystal substrates are combined has a length of about 8 mm to 50 mm. The present invention is also applicable to a polycrystalline diamond, and, as the conditions for the substrate in this case, the conditions described above are applicable except for the condition for plane orientation. The length of one side of a polycrystalline diamond substrate can be set to 20 mm to 300 mm. Further, although the polycrystalline diamond substrate is preferably polished to be flat, it can also be used in an uneven, as-grown state without being polished.

<Diamond Layer>

Diamond layer 3 is an epitaxial growth layer formed by the CVD method, and is grown in an upward direction in FIG. 1. The plane orientation of the main surface of substrate 1 is transferred to an upper surface of diamond layer 3.

Diamond layer 3 may be a single crystal, or may be a polycrystal. Since a single crystal diamond is more expensive, diamond layer 3 is preferably a single crystal, so that the effect of the embodiment of the present invention can be more significantly exhibited. Diamond layer 3 may be electrically conductive, or may be insulating. Since most of industrially applied diamonds are insulating, diamond layer 3 is generally preferably insulating, with which the effect of the embodiment of the present invention is significantly exhibited. Electric conductivity is obtained in a state where boron or phosphorus is added in a diamond crystal. Since an electric field is less likely to penetrate into an electrically conductive layer when compared with an insulating layer, it is difficult to separate the electrically conductive layer.

<Non-Diamond Layer>

Non-diamond layer 2 can be formed, for example, by implanting ions from the main surface of substrate 1. Substrate 1 is divided into two layers by ion implantation. Namely, non-diamond layer 2 is an ion implantation layer, which is a layer in which the diamond structure is destroyed and graphitization proceeds, and which has electric conductivity. The front surface-side layer of the divided two layers, that is, the layer on which the diamond layer is to be epitaxially grown, maintains the diamond crystal structure. Further, some of ion-implanted atoms are also mixed therein to an extent not to destroy the crystal structure, and remain without being electrochemically etched. Thereby, the front surface-side layer has characteristics different from those of a common diamond surface, which may affect properties such as wettability. It should be noted that, when element distribution by SIMS is examined, the ion-implanted atoms show one end of a steep base of an impurity profile specific to ion implantation, which can be distinguished from the profile of an impurity introduced when the diamond layer is synthesized. Such steep introduction of an impurity is difficult to be performed by synthesis. For this reason, the front surface-side layer of the divided two layers is referred to as a layer containing implanted ions.

The depth of non-diamond layer 2 from the main surface of substrate 1 is preferably more than or equal to 0.05 μm and less than or equal to 3 μm, and further preferably more than or equal to 0.2 μm and less than or equal to 1 μm, at a peak. Thereby, an internal graphite layer can be effectively thickened while maintaining the crystallinity for an epitaxial layer thereabove. It should be noted that the depth from the main surface of substrate 1 means the distance between the main surface of substrate 1 and a surface of the non-diamond layer which is closest to the main surface of substrate 1.

The thickness of non-diamond layer 2 is preferably more than or equal to 0.03 μm and less than or equal to 0.5 μm, and further preferably more than or equal to 0.05 μm and less than or equal to 0.3 μm, in half width. Thereby, the internal graphite layer can be effectively thickened while maintaining the crystallinity for the epitaxial layer thereabove.

In order to allow non-diamond layer 2 to be etched with an electrochemical technique, the periphery of non-diamond layer 2 should be at least partially, preferably entirely, in contact with the etching solution when it is dipped therein.

<Diamond>

The diamond in accordance with the embodiment of the present invention is a diamond including diamond layer 3, obtained by electrochemically etching non-diamond layer 2 of diamond composite body 5 and separating diamond layer 3 and substrate 1. Since the diamond in accordance with the embodiment of the present invention is separated from the diamond composite body at a high speed, manufacturing cost thereof is reduced.

The diamond in accordance with the embodiment of the present invention has a set of main surfaces, and includes a line-shaped or lattice-shaped optical distortion in a surface of at least one of the main surfaces. The diamond in accordance with the embodiment of the present invention is obtained by growing the diamond layer to close again the vicinity of a diamond layer growth surface (opening) of each groove introduced in the substrate. When the diamond layer is grown, in a combined portion obtained by closing the vicinity of the opening of each groove, the diamond crystal grows in a horizontal direction, and in the diamond layer formed on the substrate, the diamond crystal grows in a vertical direction. This difference in growth manner leads to a difference in crystal integrity and a difference in impurity intake amount. Accordingly, a slight difference in crystallinity and a difference in impurity intake amount occur between the combined portion obtained by closing the vicinity of the opening of each groove and the portion of the diamond layer formed on the substrate.

Even after the diamond is separated from the substrate, the difference in crystal integrity and the difference in impurity intake amount are observed as a difference in optical distortion property, a difference in the spectra of photoluminescence (PL) and cathode luminescence (CL), or a difference in secondary electron intensity, reflected electron intensity, and absorbed current intensity. Accordingly, by observing these properties, it is possible to determine whether a diamond has been fabricated using the diamond composite body of the present embodiment. As for the properties other than the optical distortion property, the ability of sensing them decreases toward a depth direction, and thus it is suitable to observe them from a separation surface. Even when the optical distortion property has a small phase difference or a small spatial resolution and it is difficult to measure it, these methods can distinguish a line-shaped optical distortion, a lattice-shaped optical distortion, and the like with a good detection sensitivity, and are effective.

The width of the grooves in the main surface of the diamond must not impair the crystallinity of the diamond layer. From this viewpoint, the width of the grooves is preferably less than or equal to 30 µm. On the other hand, the width of the grooves is preferably more than or equal to 0.1 µm to facilitate the permeation of the etching solution when separating the diamond from the diamond composite body.

Distribution of the optical distortion can be observed with an apparatus for evaluating a double refractive index and a phase difference. It can be observed, for example, using WPA200 manufactured by Photonic Lattice, Inc, or the like. The value of a phase difference indicates a value obtained by performing a measurement on a sample having a thickness of 50 µm to 500 µm at a wavelength of 543 nm, and converting a measured value into a value per 100 µm. The observation utilizes that there is a proportional relation between the phase difference and a layer thickness.

When PL and CL are measured under a condition such as room temperature, around the sublimation temperature of dry ice, around the boiling temperature of liquid nitrogen, or a low temperature less than or equal to 40K, differences in optical distortion, defects, and impurity intake amount between an upper portion above each groove and an upper portion other than that can be clearly observed. The excitation light for PL has a short wavelength of preferably less than or equal to 600 nm, more preferably less than or equal to 550 nm, and further preferably less than or equal to 500 nm. The secondary electron intensity, the reflected electron intensity, and the absorbed current intensity can be evaluated with a scanning electron microscope, at room temperature or a temperature from room temperature to the boiling temperature of liquid nitrogen. These measurement means may be able to detect the properties even when the aforementioned WPA200 or the like fails to measure the properties due to low sensitivity or resolution, and are effective as means to distinguish whether a diamond has been obtained by the manufacturing method of the present invention.

Since the intensities of PL and CL are measured merely for relative comparison, they can be observed by obtaining intensity mapping at a specific wavelength. The spectra may be observed by observing color distribution of luminescence in a photograph, or the spectra may be taken at a typical part and compared. In a portion having an optical distortion, commonly known spectra (luminescence peaks) related to nitrogen and silicon and a relevant background intensity are different. In correlation therewith, a secondary electron image, a reflected electron image, and an absorbed current image in SEM and the like are also applicable to find intensity distribution.

It can be objectively determined through observation that distribution of phase differences and distribution of PL and CL are arrayed in a line shape or a lattice shape. It should be noted that they can be mechanically evaluated by a method described below. When mapping data of the phase differences, the intensities of PL and CL, the secondary electron intensity, the reflected electron intensity, and the absorbed current intensity are each line-scanned, and a graph is plotted with intensity on the y-axis and positional information on the x-axis, regions having high intensities (peaks) are periodically seen. It should be noted that regions having low intensities (valleys) may be periodically seen. When the mapping data are each line-scanned at another position to be parallel to the previous line, similar regions having high intensities (peaks) or regions having low intensities (valleys) are periodically seen. When at least 10 lines are similarly taken, and the regions having high intensities or the regions having low intensities (valleys) are superimposed, a periodic structure (periodic structure of peaks/valleys) is seen more clearly.

The periodic structure means that a threshold is set, a region having a value higher than the threshold is defined as a region having a high intensity and a region having a value lower than the threshold is defined as a region having a low intensity, and the regions having high intensities and the regions having low intensities exist periodically. The size of one period corresponds to the interval between the grooves. When the line is orthogonal to the grooves, the size of one period is equal to the value of the interval between the grooves, and when the line is deviated by an angle θ, the size of one period becomes longer by 1/sin θ. In the case where the grooves are formed in a lattice shape, a periodic structure can be sensed by performing two types of line-scans to be orthogonal to each other and similarly taking at least 10 lines for each line-scan. However, in the case where the grooves have a lattice shape, a line-scan performed at an angle suitable for the grooves is more recognizable. Although various shapes such as a curve pattern and a random pattern can be adopted as a pattern of the grooves, a line pattern or a lattice pattern can be formed simply and efficiently.

When the size of one period is equal to the interval between the grooves, the interval between periodic peaks is preferably more than or equal to 10 µm and less than or equal to 5 mm, more preferably more than or equal to 100 µm and less than or equal to 5 mm, and further preferably more than or equal to 500 µm and less than or equal to 3 mm. Here, the interval between periodic peaks means a minimum distance from the center of a periodic peak in the width direction to the center of an adjacent periodic peak in the width direction.

The optical distortion accounts for a region of preferably more than or equal to 20%, more preferably more than or equal to 40%, more preferably more than or equal to 60%, and further preferably more than or equal to 80%, of the surface of the main surface of the diamond. The region having the optical distortion can be observed as an area of the pattern of the grooves. When the pattern of the grooves accounts for an area of more than or equal to 20%, preferably more than or equal to 40%, more preferably more than or equal to 60%, and further preferably more than or equal to 80%, of the surface of the main surface of the diamond, it is easily recognized whether a diamond is the diamond obtained from the diamond composite body of the present embodiment. The area ratio of the pattern of the grooves can be calculated by dividing an area covered by the range of a periodic peak intensity at the time of the aforementioned line-scan (i.e., an area from end to end of periodic peaks and from end to end of the line-scan including the periodic peaks), by the entire surface area of the main surface of the diamond. When an attempt is made to form a diamond layer having a good crystallinity using a diamond single crystal as a substrate, the combined portion obtained by closing the vicinity of the opening of each groove and the diamond layer formed on the substrate are matched in a crystalline state, and thus the line pattern or the lattice pattern tends to become faint. When the optical distortion is observed in an area of more than or equal to 20% of the surface of the main surface of a diamond, it can be determined that the diamond is the diamond obtained from the diamond composite body of the present embodiment.

In the diamond in accordance with the embodiment of the present invention, in a region of more than or equal to 90% of the surface of the main surface of the diamond, an average value of phase differences of the optical distortion is less than 50 nm, preferably less than 30 nm, further preferably less than 10 nm, and furthermore preferably less than 5 nm. A phase difference is a value measured at a wavelength of 543 nm and converted per 100 μm in thickness (unit: nm), and can be measured with WPA200 manufactured by Photonic Lattice, Inc. The entire sample is observed by connecting data of a plurality of fields of view, with each field of view at least having a range of 5 to 10 mm. Since less than 10% of the entire sample may be a portion which is unmeasurable due to a reason in terms of the apparatus or the principle, or an inevitable flaw, defect, or the like, there is no problem in evaluating the sample with such a portion being excluded.

In the diamond in accordance with the embodiment of the present invention, in a region of more than or equal to 90% of the surface of the main surface of the diamond, a maximum value of phase differences in a region except for a periodic peak area of the optical distortion is preferably less than or equal to 90 nm, more preferably less than or equal to 50 nm, more preferably less than or equal to 10 nm, and further preferably less than or equal to 5 nm. Here, the periodic peak area means a range in which a portion having a high optical distortion in a line shape or a lattice shape is defined as a peak and which extends from the center of the peak toward all directions by a distance that is twice the full width at half maximum of the peak. The phase difference is measured in the same way as the aforementioned measuring method. The grooves in the main surface of the diamond have an effect of concentrating defects at portions which bridge the grooves, and an effect of relaxing a long-distance distortion within the surface, and thereby the optical distortion in the entire diamond is reduced, and the optical distortion in the diamond layer formed on the substrate above the non-groove portion is reduced.

In the diamond in accordance with the embodiment of the present invention, the optical distortion in the surface of the main surface is preferably substantially parallel to the <100> direction. Since such a diamond is separated from the diamond composite body in a shorter separation time, it can be manufactured at low cost.

The diamond in accordance with the embodiment of the present invention includes a diamond layer having a set of main surfaces, and a graphite layer arranged on a region of more than or equal to 50% of a surface of at least one of the main surfaces of the diamond layer, the graphite layer having line-shaped or lattice-shaped grooves penetrating to the diamond layer. The diamond of the present embodiment is obtained from the diamond composite body, and the graphite layer corresponds to a portion of the layer formed by implanting ions into a diamond substrate. In the diamond, the graphite layer has grooves corresponding to the grooves formed in the substrate of the diamond composite body. This structure of the diamond helps an excessive bonding material flow out of the grooves when the diamond is bonded as a heatsink or a cutting bite to a heterogeneous substrate such as a heat dissipation plate or a shank. This structure can also improve adhesion between the diamond and the heat dissipation plate and facilitate heat dissipation.

The diamond in accordance with the embodiment of the present invention is a polycrystalline diamond having a first main surface and a second main surface, including a line-shaped or lattice-shaped optical distortion in a surface of the first main surface, an average particle size of a surface of the second main surface being more than or equal to 50% and less than or equal to 200%, preferably more than or equal to 70% and less than or equal to 140%, more preferably more than or equal to 80% and less than or equal to 120%, and further preferably more than or equal to 90% and less than or equal to 110%, of an average particle size of the surface of the first main surface in a region except for a periodic peak area of the optical distortion. The line-shaped or lattice-shaped optical distortion can be recognized from periodic peaks arrayed in a line shape or a lattice shape.

The periodic peaks mean that, when a line-scan is performed to traverse a portion having a high optical distortion, peaks of values of the optical distortion (phase difference) appear periodically. In the case where the grooves in the substrate have a line shape, there is one type of periodic peak, whereas in the case where the grooves have a lattice shape, there are two types of periodic peaks. However, the line-scan is performed so as not to be parallel to any of the grooves. If the line-scan is performed to be parallel to one of the grooves, one period disappears. Further, the lattice-shaped grooves in the substrate may have different periods in the vertical and horizontal directions. When the distortion in the diamond is observed, the substrate has been removed, and thus the grooves in the substrate cannot be recognized clearly. However, even in such a state, the period of the distortion remains. This is true in not only the polycrystalline diamond but also the diamond including the aforementioned single crystal as a whole.

When the size of one period is equal to the interval between the grooves, the interval between periodic peaks is preferably more than or equal to 10 μm and less than or equal to 5 mm, more preferably more than or equal to 100 μm and less than or equal to 5 mm, and further preferably more than or equal to 500 μm and less than or equal to 3 mm. Here, the interval between periodic peaks means the distance from the center of a periodic peak in the width direction to the center of an adjacent periodic peak in the width direction.

The periodic peak area means an area having a width in a range which extends from a peak position toward all directions by a distance that is twice the full width at half maximum of the peak. Preferably, the period of the grooves is processed under the condition that the grooves are apart by a distance that is twice or the same as the full width at half maximum of the peak. This is true in not only the polycrystalline diamond but also the diamond including the aforementioned single crystal as a whole.

The average particle size of the surface of each main surface of the diamond is a value measured by SEM observation.

<Tool>

A tool in accordance with the embodiment of the present invention is a tool including the diamond. Since the tool in accordance with the embodiment of the present invention includes the diamond separated from the diamond composite body at a high speed, manufacturing cost thereof is reduced.

Specifically, the tool in accordance with the embodiment of the present invention is a cutting tool such as a diamond bite, a drill, an end mill, a cutting-edge replaceable cutting tip for a drill, a cutting-edge replaceable cutting tip for an end mill, a cutting-edge replaceable cutting tip for milling, a cutting-edge replaceable cutting tip for cutting, a metal saw, a gear cutting tool, a reamer, or a tap. Further, the tool in accordance with the embodiment of the present invention is not limited to a cutting tool, and can be a grinding tool, a wear-resistant tool, a component, or the like. Examples of the grinding tool can include a dresser and the like. Examples of the wear-resistant tool or the component can include a die, a scriber, a water or powder jet nozzle, a guide such as a wire, or a heat dissipation component (heatsink), a window material component, and the like.

<Method for Manufacturing of Diamond>

A method for manufacturing the diamond in accordance with the embodiment of the present invention will be described with reference to FIG. 4(A) to FIG. 4(D).

Figure 4:
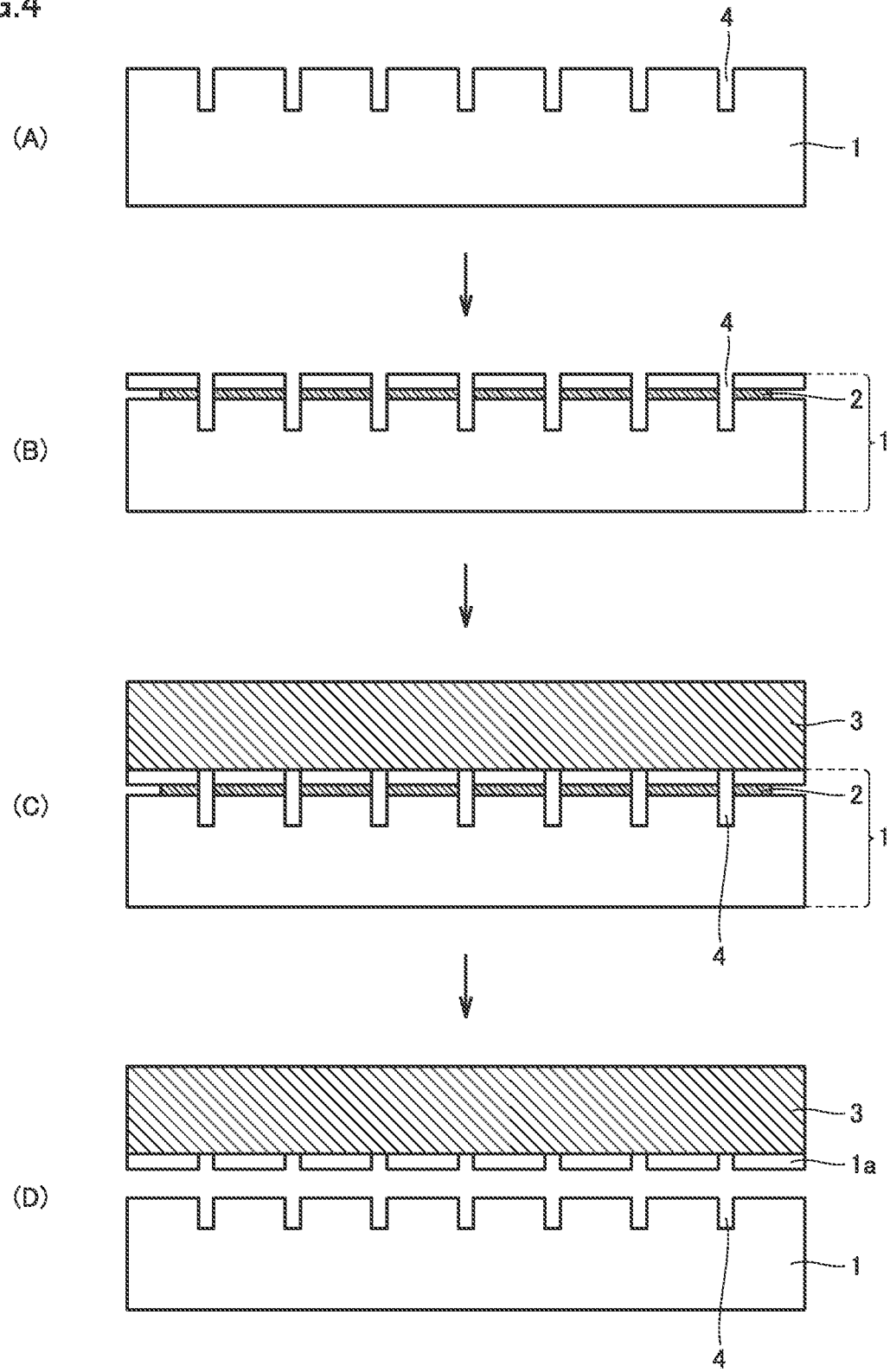
FIG. 4(A) to FIG. 4(D) schematically show a method for manufacturing a diamond in accordance with one aspect of the present invention.

Referring to FIG. 4(A), first, a substrate including a diamond seed crystal is prepared. The substrate is preferably cut such that a main surface thereof has an off angle of more than or equal to 0° and less than or equal to 15° with respect to the (001) plane. Further, a surface of the main surface is preferably smoothed by mechanical polishing or the like, and is etched by reactive ion etching by about 1 μm to 50 μm.

Next, grooves 4 are formed in the main surface of the substrate to prepare substrate 1 having grooves 4 in the main surface. Grooves 4 can be formed, for example, by patterning a mask on the diamond with a photolithographic technique, and performing reactive ion etching (RIE) on the diamond. Alternatively, grooves 4 can be directly processed by laser. The former technique can provide cleaner and finer processing, whereas the latter technique is less expensive and can perform the whole process in a shorter time. Deeper and narrower grooves are more preferable, because they lead to the growth of a flat epitaxial layer.

Next, referring to FIG. 4(B), non-diamond layer 2 is formed at a constant depth from the surface of the main surface of substrate 1 by implanting ions into substrate 1. Since the depth from the surface of the substrate and the thickness of non-diamond layer 2 to be formed vary mainly depending on the type of ions used, the implantation energy, and the irradiation amount, these conditions should be determined before performing ion implantation. Design of an ion implantation layer can be substantially correctly calculated and predicted by Monte Carlo simulation such as the TRIM code.

The implantation energy is preferably more than or equal to 100 keV and less than or equal to 3 MeV, and further preferably more than or equal to 200 keV and less than or equal to 400 keV. When the implantation energy is within the above range, the diamond crystal structure in the surface of the main surface of substrate 1 can be maintained. The irradiation amount (dose amount) is preferably more than or equal to $1\times10^{15}$ ions/cm$^2$ and less than or equal to $1\times10^{17}$ ions/cm$^2$, and further preferably more than or equal to $5\times10^{15}$ ions/cm$^2$ and less than or equal to $5\times10^{16}$ ions/cm$^2$. When the irradiation amount is within the above range, the diamond structure of non-diamond layer 2 is destroyed, and graphitization proceeds in non-diamond layer 2 to an extent that allows non-diamond layer 2 to be etched by a chemical technique. Further, the irradiated main surface has a crystallinity enough to allow epitaxial growth by the chemical vapor synthesis method.

Since the object of implanting ions is to destroy the diamond structure and form the layer in which graphitization proceeds, any element that can be ion-implanted, such as carbon, boron, nitrogen, oxygen, phosphorus, neon, hydrogen, helium, aluminum, silicon, sulfur, argon, or the like, can be used as the type of ions to be implanted. Of these elements, carbon, nitrogen, oxygen, hydrogen, or helium is preferable. When such a light element is used as ions to be implanted, graphite can be formed inside substrate 1 without destroying the crystallinity of the surface of substrate 1.

Next, referring to FIG. 4(C), diamond layer 3 is grown on the main surface of substrate 1 by the chemical vapor synthesis method. For example, substrate 1 is placed within a vacuum chamber, hydrocarbon gas including methane, hydrogen gas, and addition gases such as an inert gas and nitrogen are introduced therein, the pressure within the vacuum chamber is controlled to 6.6 kPa to 26.6 kPa, microwave power is introduced therein, and the temperature within the chamber is heated to 800 to 1100° C. Under such conditions, a diamond is epitaxially grown on the main surface of substrate 1.

Next, referring to FIG. 4(D), diamond layer 3 is separated from substrate 1 by electrochemically etching non-diamond layer 2. In non-diamond layer 2, graphitization proceeds and electric conductivity is increased. Accordingly, by electrochemically etching non-diamond layer 2 to remove the same, diamond layer 3 can be separated from substrate 1. It should be noted that it is considered that a portion of the substrate (indicated by 1a in FIG. 4(D)) which has been present on a side closer to the diamond layer than non-diamond layer 2 adheres to diamond layer 3.

As an etching solution, any of pure water, an alkaline solution, and an acid solution can be used. Although the type of the alkaline solution is not particularly limited, an aqueous solution of an alkali metal hydroxide or an alkali earth metal hydroxide such as potassium hydroxide, calcium hydroxide, or lithium hydroxide, or aqueous ammonia or the like can be used, for example. In particular, an aqueous solution of sodium hydrogen carbonate, sodium sesquicarbonate, sodium carbonate, or sodium hydroxide which is inexpensive and easily available can be suitably used. In addition, an aqueous solution of fatty acid sodium or fatty acid potassium can also be suitably used. Although the type of the acid solution is not particularly limited, a strong acid such as sulfuric acid or nitric acid, or a weak acid such as a carbonic acid can be used, for example. In particular, acetic acid or citric acid which is inexpensive and easily available can be suitably used.

An etching tank is not particularly limited as long as it is made of a material having corrosion resistance to the etching solution, and an etching tank made of Teflon (registered trademark) or the like can be used. Electrodes are not particularly limited as long as they are hardly deteriorated when they electrolyze the etching solution, and platinum electrodes or metal electrodes having a liquid contact portion coated with platinum can be used. It should be noted that an alternating current voltage or preferably a direct current voltage is applied between the electrodes.

By placing the diamond composite body between the electrodes in the etching solution and applying the direct current voltage between the electrodes, non-diamond layer 2 is etched to separate substrate 1 and diamond layer 3. While the direct current voltage depends on the distance between the electrodes, it is preferable to set the voltage to provide an electric field of 100 V/cm to 1000 V/cm to between the electrodes.

Thus, the diamond including diamond layer 3 can be manufactured.

Example 1

Hereinafter, the embodiment of the present invention will be further specifically described based on examples. However, the embodiment of the present invention is not limited thereto.

[Samples 1 to 6]

(Preparation of Substrate)

First, a high-temperature high-pressure synthesized, type Ib single crystal diamond substrate having a size of 6 mm×6 mm and a thickness of 1 mm was prepared. The substrate had a main surface having an off angle of 3° with respect to the (001) plane. The surface of the substrate was mechanically polished, and thereafter the surface of the substrate was etched by reactive ion etching by a thickness of 1 μm to 5 μm. Next, grooves were formed in the main surface of the substrate by photolithographic and RIE techniques to fabricate the substrate having grooves in the main surface. The grooves had a shape parallel to the <100> direction as shown in FIG. 2. Width W, depth D, the value of D/W, the interval between the grooves, and distance 1 from the outer edge of the substrate were set as shown in Table 1.

(Formation of Non-diamond Layer)

Next, a non-diamond layer was formed by implanting carbon ions from the main surface of the substrate. The carbon ions were implanted at an implantation energy of 300 keV and an irradiation amount of $1 \times 10^{16}$ ions/cm². The depth of the non-diamond layer from the surface of the main surface of the substrate was 0.31 μm, and the thickness thereof was 0.07 μm.

(Formation of Diamond Layer)

Next, the substrate having the non-diamond layer formed therein was placed within a vacuum chamber of a microwave plasma CVD apparatus such that its main surface was exposed. Then, hydrogen gas, methane gas, and nitrogen gas were introduced and microwave power was supplied into the vacuum chamber, and the pressure within the vacuum chamber was gradually controlled to 13.3 kPa. Eventually, the substrate was set to have a temperature of 950° C., and was subjected to a microwave plasma CVD method. Thereby, a single crystal diamond layer having a thickness of 500 μm was formed on the substrate, and a diamond composite body was obtained. On this occasion, the composition ratio (volume %) of the gases was set such that hydrogen gas:methane gas:nitrogen gas=100:15:0.1.

(Separation of Diamond Layer)

Next, a diamond separation apparatus was prepared. An aqueous solution of citric acid having a pH of 6 was used as an etching solution. A beaker made of Teflon (registered trademark) was used as an etching tank, and platinum electrodes were used as electrodes.

Then, the substrate having the diamond layer formed thereon (sample 1) was placed between the electrodes of the separation apparatus in the etching solution, with the interval between the electrodes being set to 1 cm. When sample 1 was allowed to stand with a voltage of 600 V being applied between the electrodes, the non-diamond layer was completely etched in six hours, and the substrate and the diamond layer were separated.

Samples 2 to 6 were prepared by the same method as that for sample 1. Samples 2 to 6 were different from sample 1 in the shape of the grooves, as shown in Table 1. These samples were each etched under the same etching conditions as those for sample 1, and a separation time for separating the substrate and the diamond layer was measured. Table 1 shows the results.

[Sample 7]

A diamond composite body of sample 7 was prepared by the same method as that for sample 1. In sample 7, grooves were not formed in the substrate. When sample 7 was etched under the same etching conditions as those for sample 1, the separation time for separating the substrate and the diamond layer was 50 hours.

TABLE 1

| | | Grooves in Substrate | | | | | | |
|---|---|---|---|---|---|---|---|---|
| Sample | Shape | Width W (μm) | Depth D (μm) | D/W | Interval between Grooves (μm) | Distance (l) between End Portion of Groove and Outer Edge of Substrate (mm) | l/L (L: Length of One Side of Substrate) (%) | Separation Time (hours) |
| 1 | FIG. 2 | 1 | 50 | 50 | 100 | 0.4 | 7 | 6 |
| 2 | FIG. 2 | 5 | 30 | 6 | 500 | 0.6 | 10 | 5.5 |
| 3 | FIG. 2 | 20 | 60 | 3 | 3000 | 1.2 | 20 | 5.2 |
| 4 | FIG. 3 | 1 | 50 | 50 | 100 | 0.4 | 7 | 4.8 |
| 5 | FIG. 3 | 5 | 30 | 6 | 500 | 0.6 | 10 | 4.4 |
| 6 | FIG. 3 | 20 | 60 | 3 | 3000 | 1.2 | 20 | 4.1 |
| 7 | no grooves | — | — | — | — | — | — | 50 |

(Results of Evaluation)

In samples 1 to 6 each using the substrate having grooves, the separation time for separating the substrate and the diamond layer was shortened to less than or equal to one eighths, when compared with that of sample 7 using the substrate having no grooves. When comparison was made between sample 2 and sample 5, and between sample 3 and sample 6, it was found that the separation time is shorter when the grooves have a lattice shape than when the grooves have a line shape.

Example 2

[Samples 11 to 21]

Substrates for samples 11 to 21 were prepared by the same method as that for sample 1. Samples 11 to 21 were different from sample 1 in the shape of the grooves, as shown in Table 2. Using each substrate, formation of a non-diamond layer, formation of a diamond layer, and separation of the diamond layer were performed under the same conditions as those for sample 1.

TABLE 2

Figure 5:
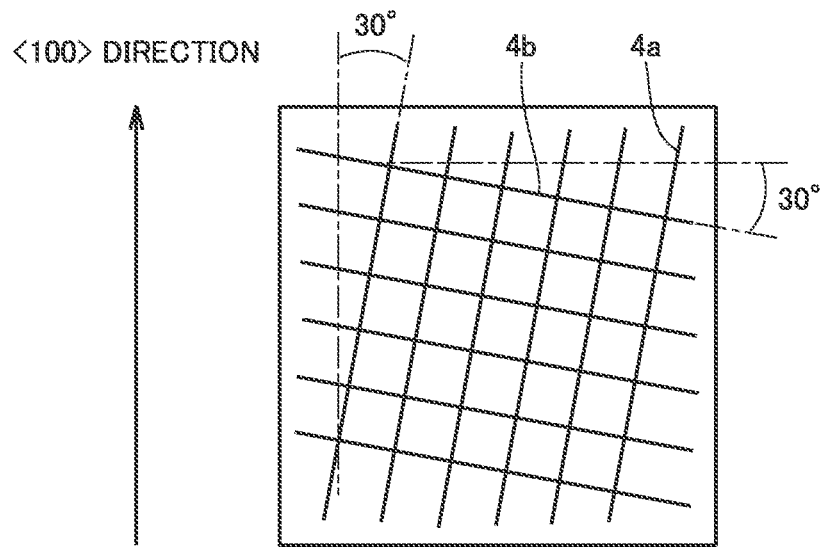
FIG. 5 is a top view of a main surface side of a substrate used in an example.
Figure 6:
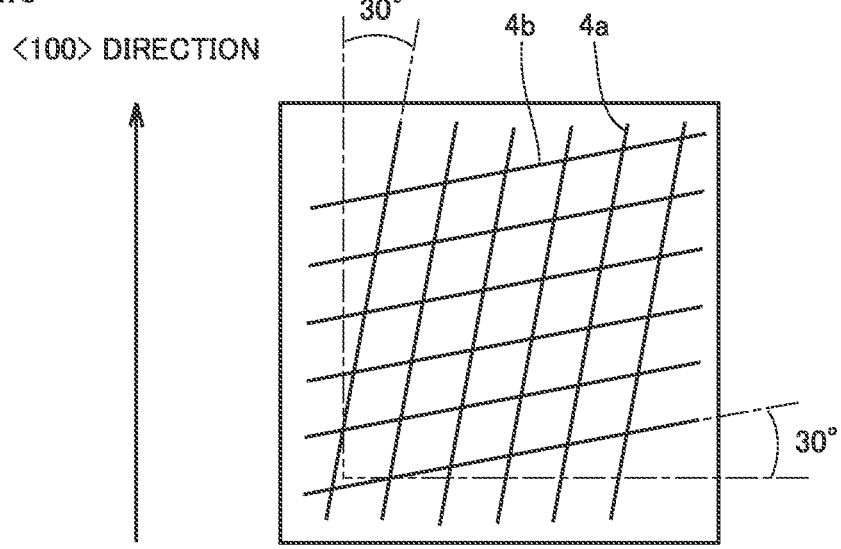
FIG. 6 is a top view of a main surface side of a substrate used in an example.

| | | Grooves in Substrate | | | | | | | | | | | | |
|---|---|---|---|---|---|---|---|---|---|---|---|---|---|---|
| | | 4a Direction | | | | | 4b Direction | | | | | Distance (l) between End Portion of Groove and Outer Edge of Substrate (mm) | l/L (L: Length of One Side of Substrate) (%) | Separation Time (hours) |
| Sample | Shape | Width W (μm) | Depth D (μm) | D/W | Interval M between Grooves (μm) | M/W | Width W (μm) | Depth D (μm) | D/W | Interval M between Grooves (μm) | M/W | | | |
| 11 | FIG. 2 | 0.1 | 3 | 30 | 50 | 500 | — | — | — | — | — | 0.6 | 10 | 15 |
| 12 | FIG. 2 | 0.5 | 25 | 50 | 500 | 1000 | — | — | — | — | — | 0.6 | 10 | 11 |
| 13 | FIG. 2 | 1.5 | 7.5 | 5 | 15 | 10 | — | — | — | — | — | 0.6 | 10 | 5.3 |
| 14 | FIG. 2 | 5 | 15 | 3 | 25 | 5 | — | — | — | — | — | 0.6 | 10 | 2.4 |
| 15 | FIG. 3 | 1 | 50 | 50 | 100 | 100 | 5 | 30 | 6 | 300 | 60 | 0.9 | 15 | 4.1 |
| 16 | FIG. 3 | 5 | 30 | 6 | 500 | 100 | 5 | 30 | 6 | 300 | 60 | 0.6 | 10 | 3.5 |
| 17 | FIG. 3 | 20 | 60 | 3 | 3000 | 150 | 20 | 60 | 3 | 1000 | 50 | 1.2 | 20 | 2.8 |
| 18 | FIG. 5 | 5 | 30 | 6 | 500 | 100 | 5 | 30 | 6 | 300 | 60 | 0.6 | 10 | 3.4 |
| 19 | FIG. 5 | 20 | 60 | 3 | 3000 | 150 | 20 | 60 | 3 | 1000 | 50 | 1.2 | 20 | 2.7 |
| 20 | FIG. 6 | 5 | 30 | 6 | 500 | 100 | 5 | 30 | 6 | 300 | 60 | 0.6 | 10 | 3.2 |
| 21 | FIG. 6 | 20 | 60 | 3 | 3000 | 150 | 20 | 60 | 3 | 1000 | 50 | 1.2 | 20 | 2.5 |

In samples 11 to 14, it was found that the sample having wider grooves is separated in a generally shorter time. When comparison was made between sample 15 and sample 16, it was found that the sample having wider grooves is separated in a generally shorter time. In samples 17, 19, and 21 having a groove width of 20 μm, the separation time is shorter than that of samples 11, 12, and 13 having a groove width of less than 2 μm. This indicates that the sample having a larger total cross sectional area of the grooves is advantageous because the etching solution permeates more easily.

It was found that the etching rate is faster in the sample having a shorter interval between the grooves, such as sample 14.

When comparison was made between sample 16 and sample 20, and between sample 17 and sample 21, the etching rate was slightly faster in the sample in which the grooves intersected with the <100> direction at an acute angle. It should be noted that the electric field for etching was set to be parallel to the direction of the grooves.

The samples having grooves parallel to <100> and grooves orthogonal to such grooves exhibited a good tendency in the strength of the substrate and the strength of the diamond layer.

Example 3

For the separated diamond layer in each of samples 1 to 7 and samples 11 to 21, the shape of an optical distortion, the area ratio of the optical distortion, phase differences, PL intensity distribution, and CL intensity distribution were evaluated. For the separated diamond layer in each of samples 11 to 21, distribution of the secondary electron intensity in SEM, distribution of the reflected electron intensity in SEM, and the absorbed current intensity in SEM were further evaluated.

The shape of the optical distortion was specified by performing an observation from the side of a front surface as a growth surface, with light substantially vertically passing through a set of main surfaces of the diamond layer, using WPA100 or 200 manufactured by Photonic Lattice, Inc.

The phase differences were measured by performing an observation from the side of the front surface as the growth surface, with the light substantially vertically passing through a set of main surfaces of the diamond layer, using WPA100 or 200 manufactured by Photonic Lattice, Inc. The phase differences were measured in a region of more than or equal to 90% of the surface of the main surface. It should be noted that the growth surface is polished such that an optical property can be evaluated.

The PL intensity distribution was measured from the side of a main surface opposite to the growth surface (the side of a back surface, i.e., a separation surface), using a spectroscopic apparatus capable of performing mapping having a microscopic laser microscope.

The CL intensity distribution, the distribution of the secondary electron intensity in SEM, the distribution of the reflected electron intensity in SEM, and the absorbed current intensity in SEM were measured from the side of the main surface opposite to the growth surface (the side of the back surface, i.e., the separation surface), using functions of a SEM manufactured by JEOL.

The area ratio of the optical distortion was calculated by dividing an area covered by the range of a periodic peak intensity at the time of the line-scan (i.e., an area from end to end of periodic peaks and from end to end of the line-scan including the periodic peaks), by the entire surface area of the main surface of the diamond. Here, the interval between the periodic peaks was set to be equal to the interval between the grooves.

Tables 3 and 4 show results of evaluation.

TABLE 3

| Sample | Shape of Optical Distortion | Observed from Front Surface Area Ratio of Recognized Pattern of Optical Distortion (%) | Observed from Front Surface Average Value of Phase Differences (nm) | Observed from Front Surface Maximum Value of Phase Differences* (nm) | Observed from Back Surface Area Ratio of Pattern Recognized in PL intensity (%) | Observed from Back Surface Area Ratio of Pattern Recognized in CL intensity (%) |
|---|---|---|---|---|---|---|
| 1 | line shape | 64 | 1 | 1 | 40 | 60 |
| 2 | line shape | 73 | 6 | 6 | 70 | 78 |
| 3 | line shape | 78 | 18 | 24 | 78 | 82 |
| 4 | lattice shape | 83 | 2 | 2 | 58 | 65 |
| 5 | lattice shape | 88 | 13 | 18 | 60 | 70 |
| 6 | lattice shape | 85 | 23 | 36 | 68 | 78 |
| 7 | — | No | 112 | 630 | No | No |

TABLE 4

| Sample | Shape of Optical Distortion | Observed from Front Surface Area Ratio of Optical Distortion (%) | Observed from Front Surface Average Value of Phase Differences (nm) | Observed from Front Surface Maximum Value of Phase Differences* (nm) | Observed from Back Surface Area Ratio of Pattern Recognized in PL intensity (%) | Observed from Back Surface Area Ratio of Pattern Recognized in CL intensity (%) | Observed from Back Surface Area Ratio of Pattern Recognizable in Secondary Electron Intensity in SEM (%) | Observed from Back Surface Area Ratio of Pattern Recognizable in Reflected Electron Intensity in SEM (%) | Observed from Back Surface Area Ratio of Pattern Recognizable in Absorbed Current Intensity in SEM (%) |
|---|---|---|---|---|---|---|---|---|---|
| 11 | line shape | 65 | 0.5 | 1 | 66 | 72 | 55 | 52 | 43 |
| 12 | line shape | 68 | 1 | 9 | 34 | 45 | 28 | 25 | 21 |
| 13 | line shape | 72 | 3 | 6 | 40 | 57 | 34 | 32 | 22 |
| 14 | line shape | 75 | 8 | 24 | 74 | 78 | 62 | 56 | 53 |
| 15 | lattice shape | 80 | 3 | 8 | 56 | 65 | 41 | 37 | 30 |
| 16 | lattice shape | 86 | 12 | 28 | 62 | 72 | 52 | 42 | 39 |
| 17 | lattice shape | 82 | 27 | 43 | 70 | 75 | 59 | 48 | 43 |
| 18 | lattice shape | 79 | 16 | 39 | 58 | 65 | 43 | 35 | 30 |
| 19 | lattice shape | 91 | 41 | 82 | 85 | 88 | 74 | 67 | 59 |
| 20 | lattice shape | 88 | 19 | 45 | 63 | 76 | 52 | 46 | 34 |
| 21 | lattice shape | 89 | 48 | 88 | 88 | 92 | 73 | 66 | 59 |

In samples 1 to 6 and samples 11 to 21, it was recognized that the optical distortion was distributed in a line shape or a lattice shape. In these samples, the optical distortion was recognized in an area of more than or equal to 60% of the surface of the main surface.

As a result of evaluation in the region of more than or equal to 90% of the surface of the main surface in each of samples 1 to 6 and samples 11 to 21, an average phase difference of the optical distortion was less than or equal to 50 nm, and a maximum value of phase differences in a portion except for a periodic peak area was less than or equal to 90 nm.

In samples 1 to 6 and samples 11 to 21, a portion distributed in a line shape or a lattice shape in the CL intensity was recognized in an area of more than or equal to 40% of the back surface, and a portion distributed in a line shape or a lattice shape in the absorbed current image in SEM was recognized in an area of more than or equal to 20% of the back surface.

Example 4

Polycrystal substrates with a diameter of 1 inch were prepared, whose average particle sizes measured by SEM observation in the 0.5 mm-square area at the center of each substrate (barycenter of the area) were 30 μm (sample 4-1) and 50 μm (sample 4-2), respectively. Average particle sizes at a position of 3 mm from the end of each substrate were 25 μm (sample 4-1) and 40 μm (sample 4-2), respectively.

Using each polycrystal substrate, formation of a non-diamond layer and separation of a diamond layer were performed under the same conditions as those for sample 3 in Example 1. Formation of the diamond layer was performed using the same apparatus as that in Example 1, under conditions described below. The pressure within the vacuum chamber was controlled to 13.3 kPa, the temperature of the substrate was set to 1100° C., and the composition ratio (volume %) of the gases was set such that hydrogen gas: methane gas=100:5. The diamond layer was grown by 500 μm.

In the case where no grooves were provided, the time required for separation was 300 hours. On the other hand, in the case where grooves were provided, the diamond layer was able to be separated in 20 hours when the substrate with a particle size of 30 μm (sample 4-1) was used, and in 25 hours when the substrate with a particle size of 50 μm (sample 4-2) was used. Front and back surfaces of a diamond including the separated diamond layer had different average particle sizes: average particle sizes on the side of a separation surface were 30 μm (sample 4-1) and 50 μm (sample 4-2), respectively, which were the same as those of the substrates, and average particle sizes on the side of a growth surface (a surface opposite to the separation surface) were 33 μm (sample 4-1) and 54 μm (sample 4-2), respectively.

Example 5

[Samples 22 to 26]

Substrates for samples 22 to 26 were prepared by the same method as that for sample 1. Samples 22 to 26 were different from sample 1 in the off angle of the substrate, and had an off angle of 0° (sample 22), 1.5° (sample 23), 8° (sample 24), 15° (sample 25), and 20° (sample 26), respectively. Using each substrate, formation of a non-diamond layer, formation of a diamond layer, and separation of the diamond layer were performed under the same conditions as those for sample 1.

Although the diamond of the present invention was able to be fabricated in each of samples 22 to 25, the diamond of the present invention was not able to be separated in sample 26, because a high distortion occurred at a bonded portion of the diamond layer above each groove and a polycrystalline portion was also observed in sample 26, which led to cracks. Average values of the optical distortion in the respective samples were 5 nm in sample 22, 1 nm in sample 23, 3 nm in sample 24, and 12 nm in sample 25. Average values of phase differences in samples 23 and 24 were smaller than that in sample 22.

It should be understood that the embodiment and examples disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The single crystal diamond of the present invention is advantageous when it is used for a tool such as a cutting tool, a grinding tool, or a wear-resistant tool, and for various products such as an optical component, a semiconductor, and an electronic component.

REFERENCE SIGNS LIST

1: substrate; 2: non-diamond layer; 3: diamond layer; 4, 4a, 4b: groove; 5: diamond composite body.

The invention claimed is:
1. A diamond, comprising:
a single crystal diamond layer having a set of main surfaces; and
a substrate containing implanted ions arranged on at least one of the main surfaces of the single crystal diamond layer,
wherein the substrate is divided into two layers by the implanted ions, the substrate containing implanted ions having line-shaped or lattice-shaped grooves penetrating to the single crystal diamond layer, and wherein the width of at least two of the grooves is more than or equal to 0.1 μm and less than or equal to 30 μm.

* * * * *